United States Patent
Kim et al.

(10) Patent No.: US 10,720,093 B2
(45) Date of Patent: Jul. 21, 2020

(54) DISPLAY DEVICE

(71) Applicants: Wondoo Kim, Gimpo-si (KR);
DaeHyun Nam, Goyang-si (KR);
KangII Kim, Seoul (KR); Minkyu Chun, Jeonju-si (KR)

(72) Inventors: Wondoo Kim, Gimpo-si (KR);
DaeHyun Nam, Goyang-si (KR);
KangII Kim, Seoul (KR); Minkyu Chun, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/190,272

(22) Filed: Nov. 14, 2018

(65) Prior Publication Data
US 2019/0147786 A1    May 16, 2019

(30) Foreign Application Priority Data
Nov. 16, 2017 (KR) .................. 10-2017-0153277

(51) Int. Cl.
G09G 3/20 (2006.01)
G09G 3/3225 (2016.01)
H01L 27/146 (2006.01)
H01L 27/32 (2006.01)

(52) U.S. Cl.
CPC ............. *G09G 3/2003* (2013.01); *G09G 3/20* (2013.01); *G09G 3/3225* (2013.01); *H01L 27/14609* (2013.01); *H01L 27/3211* (2013.01); *G09G 2310/0297* (2013.01)

(58) Field of Classification Search
CPC combination set(s) only.
See application file for complete search history.

(56) References Cited

U.S. PATENT DOCUMENTS

2017/0092188 A1* 3/2017 Kim .................... G09G 3/2096

FOREIGN PATENT DOCUMENTS

KR     20100069900 A     6/2010

* cited by examiner

*Primary Examiner* — Deeprose Subedi
(74) *Attorney, Agent, or Firm* — Polsinelli PC (57) ABSTRACT

Display device may comprise a display panel which includes a plurality of pixels including a plurality of sub pixels implementing different colors and a plurality of data lines connected to the sub pixels, a data driver including a first output channel and a second output channel for supplying a data signal to a corresponding one of the plurality of data lines; and a MUX driver disposed between the display panel and the data driver, and controls data outputs of the plurality of data lines connected to the first output channel and the second output channel in accordance with a resolution of an image signal input from the outside.

19 Claims, 7 Drawing Sheets

DISPLAY DEVICE

CROSS REFERENCE TO RELATED APPLICATION

This application claims the priority of Korean Patent Application No. 10-2017-0153277 filed on Nov. 16, 2017, in the Korean Intellectual Property Office, the disclosure of which is incorporated herein by reference in its entirety.

BACKGROUND

Field of the Disclosure

The present disclosure relates to a display device, and more particularly, to a display device which controls data output in accordance with a resolution.

Description of the Background

A display field which visually expresses electrical information signals is rapidly being developed. In response to this, various display devices having excellent performances such as thin-thickness, light weight, and low power consumption have been developed. Examples of such a display device include a liquid crystal display device (LCD) and an organic light emitting display device (OLED).

Such a display device includes a display panel in which pixel arrays for displaying images are disposed and driving circuits such as a data driving circuit which supplies a data signal to data lines disposed in the display panel, a gate driving circuit which sequentially supplies gate pulses to gate lines disposed in a display area, and a timing controller which controls the data driving circuit and the gate driving circuit.

Among the driving circuits, the data driving circuit converts a digital data signal into an analog video signal in response to a data control signal output from the timing controller to supply the converted analog video signal to the data lines of the display panel. In this case, a general data driving circuit requires output channels as many as the number of data lines of the display panel.

However, recently, since a size and a resolution of the display device are being increased, when the output channels of the data driving circuit need to be installed as many as the number of data lines disposed in the display panel, a manufacturing cost may be correspondingly increased.

SUMMARY

Accordingly, the present disclosure is to provide a display device which is capable of controlling data output by means of a MUX driver in accordance with a resolution.

In addition, the present disclosure is to provide a display device which may reduce unnecessary power consumption at a low resolution.

According to an aspect of the present disclosure, the display device may include a display panel which includes a plurality of pixels including a plurality of sub pixels implementing different colors and a plurality of data lines connected to the sub pixels, a data driver including a first output channel and a second output channel for supplying a data signal to a corresponding one of the plurality of data lines, and a MUX driver disposed between the display panel and the data driver and controls data outputs of the plurality of data lines connected to the first output channel and the second output channel in accordance with a resolution of an image signal input from the outside.

According to another aspect of the present disclosure, the display device may include a display panel including a plurality of data lines, a data driver including a first output channel and a second output channel for supplying a data signal to a corresponding one of the plurality of data lines, and a MUX driver disposed between the display panel and the data driver and outputs data having different polarities when a resolution of an image signal input from the outside is high and outputs data having the same polarity when the resolution of an image signal input from the outside is low.

According to the present disclosure, the MUX driver may be controlled by a MUX driving control signal and multi-enable signals which may select an output channel and data lines corresponding to the output channel, in accordance with the resolution.

According to the present disclosure, when the input image signal has a low resolution, the input image signal is output through only the output channel and some of data lines corresponding to the output channel and data having the same polarity as the output data is copied to be output from a data line from which the data is not output, so that power consumption of the display device may be reduced.

The effects according to the present disclosure are not limited by the contents exemplified above, and more various effects are included in the specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to the aspects described below in detail together with the accompanying drawings. However, the present disclosure is not limited to the aspect disclosed herein but will be implemented in various forms. The aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". It is to be understood that an element or layer is referred to as being "on" another element or layer, including either intervening layers or other elements directly on or in between. When an element is described as being "connected," "coupled," or "connected" to another element, the element may be directly connected or connected to the other element. However, it should be understood that other elements may be "interposed" between each element, or each element may be "connected," "coupled," or "connected" through another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

The sizes and thicknesses of the individual components shown in the drawings are shown merely for convenience of explanation and the present disclosure is not necessarily limited to the size and thickness of the components shown in the drawings.

Each of the features of the various aspects of the present disclosure can be combined or combined with each other partly or entirely. The features of the various aspects can be technically interlocked and driven as well. The features of the various aspects can be practiced independently or in conjunction with each other independently of each other.

Even though the exemplary aspects of the present disclosure will be described based on a liquid crystal display device, the present disclosure is not limited to the liquid crystal display device and is applicable to all display devices which include a multiplexer, that is, a MUX, disposed between a data driving circuit and a display panel, such as an organic light emitting display device.

Hereinafter, the present disclosure will be described with reference to the accompanying drawings.

Figure 1:
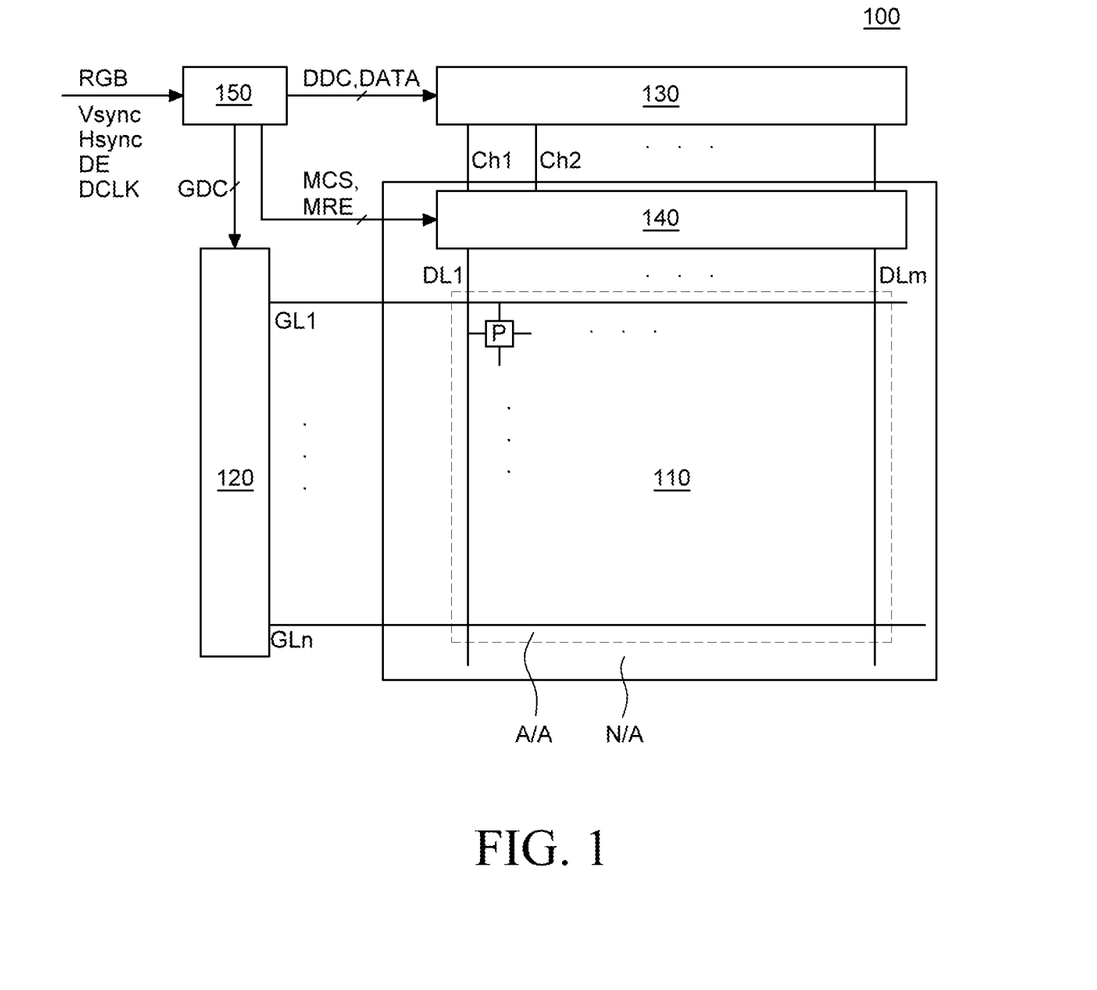
FIG. 1 is a block diagram for explaining a display device according to an exemplary aspect of the present disclosure.
Figure 2:
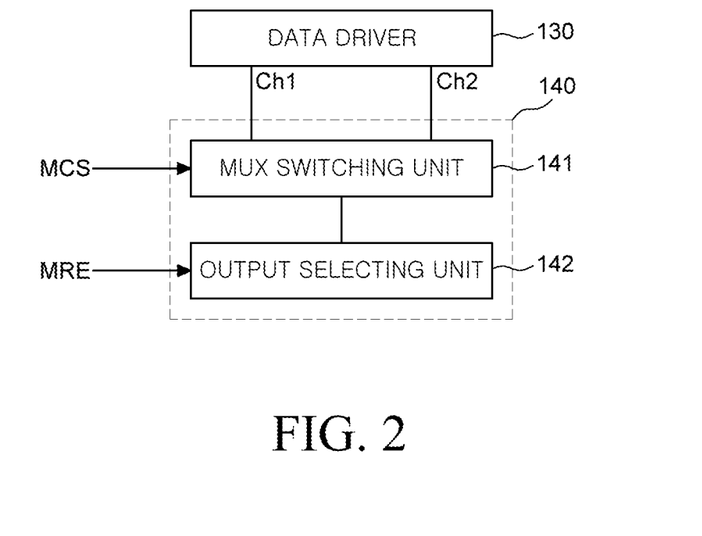
FIG. 2 is a block diagram for explaining a MUX driver of a display device according to an exemplary aspect of the present disclosure.

FIG. 1 is a block diagram for explaining a display device according to an exemplary aspect of the present disclosure. FIG. 2 is a block diagram for explaining a MUX driver of a display device according to an exemplary aspect of the present disclosure.

Referring to FIG. 1, a display device 100 according to an exemplary aspect of the present disclosure includes a display panel 110, a gate driver 120, a data driver 130, a MUX driver 140, and a timing controller 150.

The display panel 110 includes a plurality of pixels P and displays images based on gray scale displayed by each pixel P. The display panel 110 includes a display area A/A where images are displayed and a non-display area N/A which is an outer peripheral area.

In the display area A/A of the display panel 110, n gate lines GL1 to GLn are disposed in a first direction and m data lines DL1 to DLm are disposed in a direction different from the first direction. The plurality of pixels P is electrically connected to the n gate lines GL1 to GLn and the m data lines DL1 to DLm and displays images by a driving signal or a driving voltage applied through the gate lines GL1 to GLn and the data lines DL1 to DLm. In the plurality of pixels P, a TFT, a pixel electrode, a storage capacitor, and a common electrode may be disposed and a liquid crystal cell is driven by an electrical field between the pixel electrode and the common electrode to display images. Each pixel P may be formed of three sub pixels corresponding to three primary colors R, G, and B or four sub pixels including three primary colors and white W, or a plurality of sub pixels including other colors in addition to the three primary colors and white.

In the non-display area N/A of the display panel 110, various signal lines and driving circuit for transmitting a control signal which controls operations of the pixels P disposed in the display area A/A may be disposed.

The gate driver 120 sequentially supplies gate signals to the gate lines GL1 to GLn in accordance with a gate driving control signal GCS transmitted from the timing controller 150. The gate driver 120 may include a shift register or a level shifter. The gate driver 120 is formed independently from the display panel 110 to be electrically connected to the display panel 110 in various methods or may be embedded on the non-display area N/A as a thin film pattern by a gate in panel (GIP) method at the time of manufacturing a substrate of the display panel 110.

The data driver 130 generates a sampling signal by a data driving control signal DCS transmitted from the timing controller 150 and changes the image data into a data signal by latching image data input from the timing controller 150 in accordance with the sampling signal, and then supplies the data signal to the data lines DL1 to DLm in response to a source output enable (SOE) signal. The data driver 130 is connected to a bonding pad of the display panel 110 by a chip on glass (COG) method or may be directly disposed on the display panel 110. In some cases, the data driver 130 may be disposed to be integrated with the display panel 110. Further, the data driver 130 may be disposed by a chip on film (COF) method. In this case, the number of channels of the data driver 130 may be one third of the number of data lines DL1 to DLm and the data driver 130 is connected to all the data lines DL1 to DLm through the MUX driver 140.

The MUX driver 140 divides one horizontal period 1H by the number of data lines DL1 to DLm connected to one channel in a time-division manner in accordance with a MUX control signal MCS transmitted from the timing controller 150 to selectively connect each data line DL1 to DLm to the channel. In this case, data lines connected to one channel may be a plurality of data lines which is connected to sub pixels implementing different colors. The MUX driver 140 may reduce the number of channels of the data driver 130 as many as it is time-divided, as compared with the display device which does not include the MUX driver.

The MUX driver 140 of the display device 100 according to the present disclosure includes a MUX switching unit 141 and an output selecting unit 142 as illustrated in FIG. 2.

The MUX switching unit 141 is disposed between the data driver 130 and the output selecting unit 142 and electrically connects one channel output from the data driver 130 to the number of data lines DL1 to DLm according to the design of the MUX. That is, the MUX switching unit 141 drives a plurality of data lines which is adjacent to each other together, among the data lines DL1 to DLm, in accordance with a plurality of MUX control signals MCS transmitted from the timing controller 150. In this case, the plurality of adjacent data lines may be connected to sub pixels implementing different colors. The plurality of MUX control signals MCS may be output from the timing controller 150 in different ways in accordance with the resolution. A detailed description thereof will be made with reference to FIGS. 3 and 4.

The output selecting unit 142 is disposed between the MUX switching unit 141 and the display panel 110 and selects only one channel among the plurality of channels by the MUX control signal MCS and the multi enable control signal MRE which are output from the timing controller 150 in accordance with the resolution to output the data to the corresponding data line. The output selecting unit 142 will be described in more detail with reference to FIGS. 3 and 4.

The timing controller 150 transmits an input image signal RGB received from a host system to the data driver 130. The timing controller 150 generates a timing control signal for controlling operation timings of the gate driver 120 and the data driver 130 using timing signals such as a clock signal DCLK, a horizontal synchronization signal Hsync, a vertical synchronization signal Vsync, and a data enable signal DE which are received together with the input image signal RGB. In this case, the horizontal synchronization signal Hsync is a signal indicating a time taken to display one horizontal line of a screen, the vertical synchronization signal Vsync is a signal indicating a time taken to display a screen of one frame, and the data enable signal DE is a signal indicating a period when a data voltage is supplied to a pixel P defined in the display panel 110. The timing controller 400 is synchronized with the timing signal to generate a control signal GCS of the gate driver 120 and a control signal DCS of the data driver 130.

The timing controller 150 may generate a plurality of MUX control signals MCS to be applied to the MUX switching unit 141 and a multi enable control signal MRE to be applied to the output selecting unit 142 in accordance with the resolution of the input image signal RGB. The plurality of MUX control signals MCS may be generated as many as the number of MUX switches disposed in the MUX switching unit 141. That is, the MUX control signals MCS generated in the timing controller 150 may correspond to the number of MUX switches disposed in the MUX switching unit 141.

More specifically, when it is determined that the resolution of the input image signal RGB is high, the MUX control signal MCS turns on all the plurality of switches disposed in the MUX switching unit 141. In contrast, when it is determined that the resolution of the input image signal RGB is low, the MUX control signal MCS turns on only some of the plurality of switches disposed in the MUX switching unit 141. The MUX control signal MCS may be a signal which turns on all the disposed switches in accordance with the design of the MUX switching unit 141 regardless of the resolution.

When it is determined that the resolution of the input image signal RGB is high, the multi enable control signal MRE turns off all the plurality of switches disposed in the output selecting unit 142. In contrast, when it is determined that the resolution of the input image signal RGB is low, the multi enable control signal MRE turns on all the plurality of switches disposed in the output selecting unit 142.

A detailed configuration of the MUX driver 140 of the display device 100 according to the exemplary aspect of the present disclosure described above is as illustrated in FIGS. 3 and 4.

Figure 3:
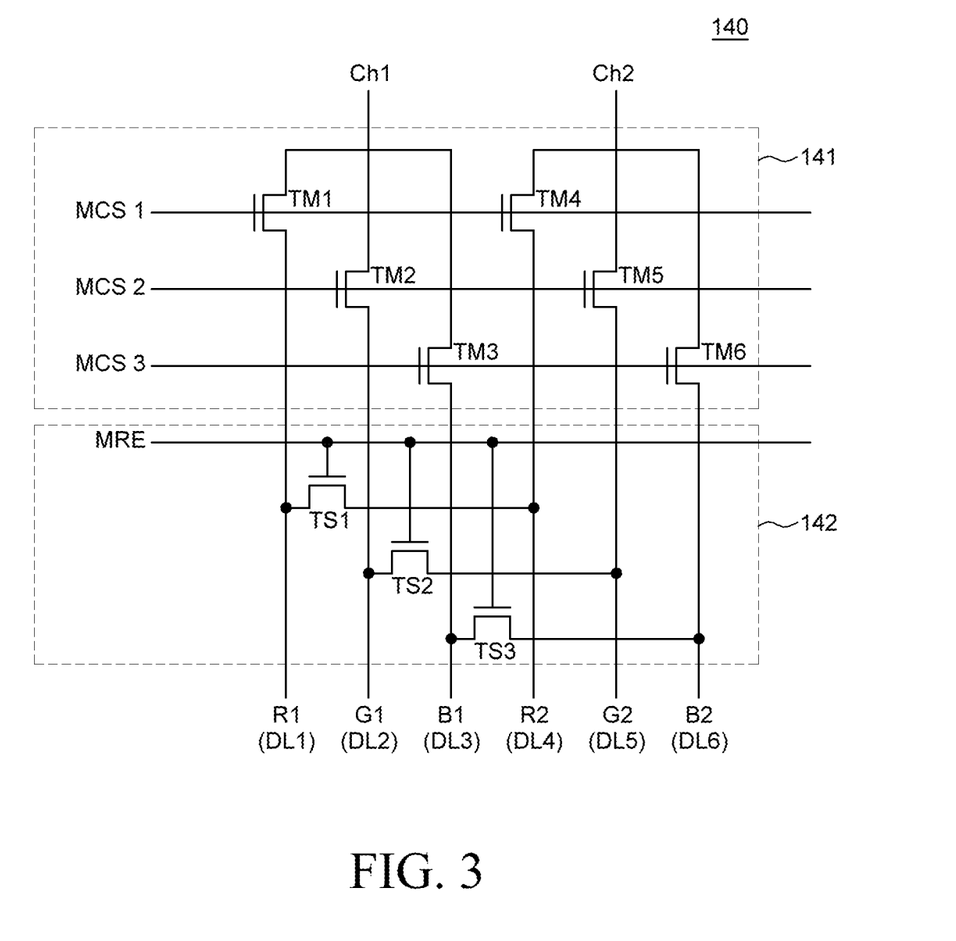
FIG. 3 is a view for explaining an example of a detailed structure of the MUX driver of FIG. 2.

FIG. 3 is a view for explaining an example of a detailed structure of the MUX driver of FIG. 2.

Referring to FIG. 3, the MUX driver 140 of the display device 100 according to the exemplary aspect of the present disclosure may include a MUX switching unit 141 configured by six MUX switches TM1, TM2, TM3, TM4, TM5, and TM6 and an output selecting unit 142 which is configured by three switches TS1, TS2, and TS3 which are turned on or turned off in accordance with the multi enable control signal MRE applied from the timing controller 150.

The MUX switching unit 141 includes first to third data lines DL1, DL2, and DL3 which are electrically connected to a first output channel Ch1 of the data driver 130 and fourth to sixth data lines DL4, DL5, and DL6 which are electrically connected to a second output channel Ch2 and first to sixth MUX switches TM1, TM2, TM3, TM4, TM5, and TM6 which are disposed in individual data lines. The first output channel Ch1 and the second output channel Ch2 may supply red data, green data, and blue data to the first to sixth data lines DL1 to DL6 during one horizontal period 1H in a time-division manner. Even though in FIG. 3, the first to sixth MUX switches TM1 to TM6 are configured by NMOS transistors, the present disclosure is not limited thereto and the first to sixth MUX switches TM1 to TM6 may be configured by PMOS transistors.

The first MUX switch TM1 and the fourth MUX switch TM4 may be turned on or off in accordance with a first multi control signal MCS1 transmitted from the timing controller 150, the second MUX switch TM2 and the fifth MUX switch TM5 may be turned on or off in accordance with a second multi control signal MCS2, and the third MUX switch TM3 and the sixth MUX switch TM6 may be turned on or off in accordance with a third multi control signal MCS3.

When a resolution of the input image signal RGB is high, during a first period of the first horizontal period 1H, the first MUX switch TM1 and the fourth MUX switch TM4 supply red data R1 and R2 supplied through the first output channel Ch1 and the second output channel Ch2, respectively, to the first data line DL1 and the fourth data line DL4, in response to the first multi control signal MCS1 corresponding to a high resolution. In this case, the red data R1 supplied to the first data line DL1 and the red data R2 supplied to the fourth data line DL4 may have different polarities. In contrast, when a resolution of the input image signal RGB is low, during a first period of the first horizontal period 1H, the first MUX switch TM1 and the fourth MUX switch TM4 supply red data supplied through any one of the first output channel Ch1 and the second output channel Ch2, to the first data line DL1 or the fourth data line DL4, in response to the first multi control signal MCS1 corresponding to a low resolution. That is, when the resolution of the input image signal RGB is low, only one of the first MUX switch TM1 and the fourth MUX switch TM4 may be turned on.

When a resolution of the input image signal RGB is high, during a second period of the first horizontal period 1H which is different from the first period, the second MUX switch TM2 and the fifth MUX switch TM5 supply green data G1 and G2 supplied through the first output channel Ch1 and the second output channel Ch2, respectively, to the second data line DL2 and the fifth data line DL5, in response to the second multi control signal MCS2 corresponding to a high resolution. In this case, the green data G1 supplied to the second data line DL2 and the green data G2 supplied to the fifth data line DL5 may have different polarities. In the meantime, when a resolution of the input image signal RGB is low, during a second period of the first horizontal period 1H, the second MUX switch TM2 and the fifth MUX switch TM5 supply green data supplied through any one of the first output channel Ch1 and the second output channel Ch2, to the second data line DL2 or the fifth data line DL5, in response to the second multi control signal MCS2 corresponding to a low resolution. That is, when the resolution of the input image signal RGB is low, only one of the second MUX switch TM2 and the fifth MUX switch TM5 may be turned on.

When a resolution of the input image signal RGB is high, during a third period of the first horizontal period 1H which is different from the second period, the third MUX switch TM3 and the sixth MUX switch TM6 supply blue data B1 and B2 supplied through the first output channel Ch1 and the second output channel Ch2, respectively, to the third data line DL3 and the sixth data line DL6, in response to the third multi control signal MCS3. In this case, the blue data B1 supplied to the third data line DL3 and the blue data B2 supplied to the sixth data line DL6 may have different polarities. In the meantime, when a resolution of the input image signal RGB is low, during the third period of the first horizontal period 1H, the third MUX switch TM3 and the sixth MUX switch TM6 supply blue data supplied through any one of the first output channel Ch1 and the second output channel Ch2, to the third data line DL3 or the sixth data line DL6, in response to the third multi control signal MCS3 corresponding to a low resolution. That is, when the resolution of the input image signal RGB is low, only one of the third MUX switch TM3 and the six MUX switch TM6 may be turned on. Here, the first horizontal period may be the same as the timing of the scan signal which is applied to the gate lines GL1 to GLn of the display panel 110 from the gate driver 120.

The output selecting unit 142 may include a first switch TS1 which electrically connects the first data line DL1 and the fourth data line DL4 which output red data R1 and R2 having different polarities in accordance with the multi enable control signal MRE, a second switch TS2 which electrically connects the second data line DL2 and the fifth data line DL5 which output green data G1 and G2 having different polarities in accordance with the multi enable control signal MRE, and a third switch TS3 which electrically connects the third data line DL3 and the sixth data line DL6 which output blue data B1 and B2 having different polarities in accordance with the multi enable control signal MRE. The first data line DL1 and the fourth data line DL4 are connected to the red sub pixel of the display panel 110, the second data line DL2 and the fifth data line DL5 are connected to the green sub pixel of the display panel 110, and the third data line DL3 and the sixth data line DL6 are connected to the blue sub pixel of the display panel 110. Further, the first to third data lines DL1 to DL3 may be connected to sub pixels implementing different colors included in the first pixel of the display panel 110, for example, a red sub pixel, a green sub pixel, and a blue sub pixel, respectively, and the fourth to sixth data lines DL4 to DL6 may be connected to sub pixels implementing different colors included in the second pixel which is adjacent to the first pixel, for example, a red sub pixel, a green sub pixel, and a blue sub pixel, respectively. That is, the first data line DL1 and the fourth data line DL4 which are electrically connected to the first switch TS1 of the output selecting unit 142, the second data line DL2 and the fifth data lines DL5 which are electrically connected to the second switch TS2 of the output selecting unit 142, and the third data line DL3 and the sixth data lines DL6 which are electrically connected to the third switch TS3 of the output selecting unit 142 are connected to different pixels which are adjacent to each other.

In the first switch TS1, a gate is connected to an enable line to which the multi enable control signal MRE is applied and a source and a drain are connected to the first data line DL1 and the fourth data line DL4, respectively.

In the second switch TS2, a gate is connected to an enable line to which the multi enable control signal MRE is applied and a source and a drain are connected to the second data line DL2 and the fifth data lines DL5, respectively.

In the third switch TS3, a gate is connected to an enable line to which the multi enable control signal MRE is applied and a source and a drain are connected to the third data line DL3 and the sixth data lines DL6, respectively.

The driving of the MUX driver illustrated in FIG. 3 will be described in more detail. When the resolution of the input image signal RGB is high, the multi enable control signal MRE turns off the first to third switches TS1 to TS3 and thus all data output from the first channel Ch1 and the second channel Ch2 is output to the first to sixth data lines DL1 to DL6. That is, when the resolution of the input image signal RGB is high, the MUX driver may be driven similarly to a MUX driver of a general display device.

In contrast, when the resolution of the input image signal RGB is low, some MUX switches of the MUX switching unit 141, for example, the fourth to sixth MUX switches TM4 to TM6 are turned off. Therefore, data may not be output to the fourth to sixth data lines DL4 to DL6 connected to the second channel Ch2 between the first channel Ch1 and the second channel Ch2. When the first to third switches TS1 to TS3 of the output selecting unit 142 are turned on by the multi enable control signal MRE, the red data R1 output through the first data line DL1 is output through the first data line DL1 and the fourth data line DL4, the green data G1 which is output through the second data line DL2 is copied to the fifth data line DL5 to be output through the fifth data line DL5. Further, the blue data B1 output through the third data line DL3 is copied to the sixth data line DL6 to be output through the six data line DL6. In this case, red, green, and blue data output through the first to third data lines DL1 to DL3 and red, green, and blue data output through the fourth to sixth data lines DL4 to DL6 may have the same polarity.

As described above, when the resolution of the input image signal RGB is high, the MUX driver 140 of the display device 100 according to the exemplary aspect of the present disclosure outputs data through all data lines DL1 to DL6 which are connected to the first channel Ch1 and the second channel Ch2 to display an image having a high resolution.

In contrast, when the resolution of the input image signal RGB is low, the red data, the green data, and the blue data are output only through the first to third data lines DL1 to DL3 connected to the first channel Ch1 between the first channel Ch1 and the second channel Ch2. Further, the red data, the green data, and the blue data which are output from the first channel Ch1 are copied to be output to the fourth to sixth data lines DL4 to DL6 connected to the second channel Ch2 which is not used. Therefore, the overall power consumption of the display device 100 may be reduced. When the resolution of the input image signal RGB is low, the image is displayed through the first pixel and also the same image as the first pixel may be displayed through the second pixel which is adjacent to the first pixel. Therefore, when the display device 100 according to the exemplary aspect of the present disclosure displays an image having a low resolution, data having one polarity is output through the MUX driver 140, so that fluctuation of a voltage level is reduced. Therefore, the power consumption of the display device 100 may be reduced.

However, in the MUX driver 140 as illustrated in FIG. 3, for example, two MUX switches TM1 and TM4 are disposed in a signal line to which the first MUX control signal MCS1 is applied so that a load of one signal line may be increased. Therefore, in the display device 100 according to the exemplary aspect of the present disclosure, a configuration of a MUX driver as illustrated in FIG. 4 which may reduce the load of the signal line has been suggested.

Figure 4:
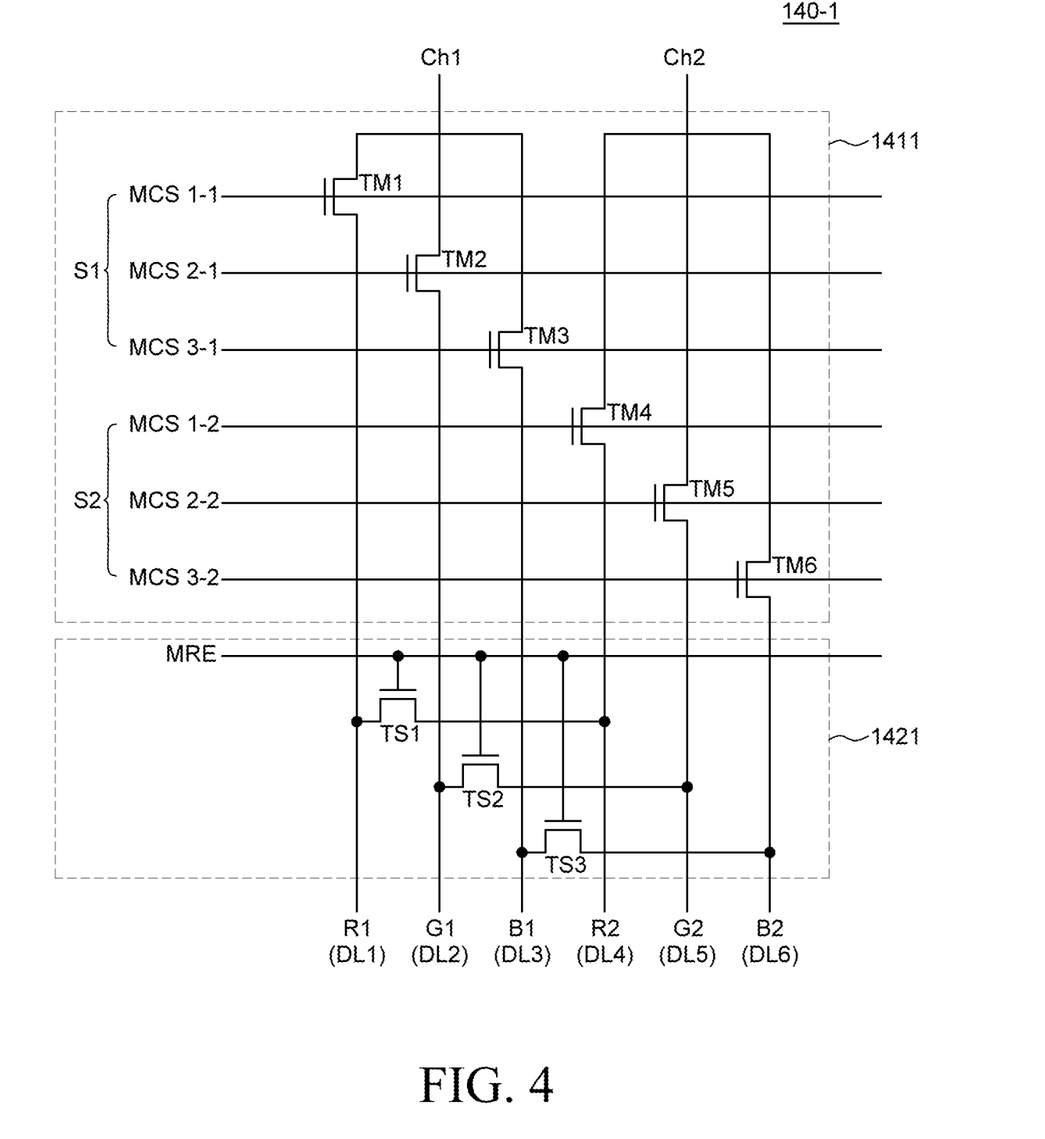
FIG. 4 is a view for explaining another example of a detailed structure of the MUX driver of FIG. 2.

FIG. 4 is a view for explaining another example of a detailed structure of the MUX driver of FIG. 2.

Referring to FIG. 4, a MUX driver 140-1 may include a MUX switching unit 1411 configured by six MUX switches TM1, TM2, TM3, TM4, TM5, and TM6 and an output selecting unit 1421 which is configured by three switches TS1, TS2, and TS3 which are turned on or turned off in accordance with the multi enable control signal MRE applied from the timing controller 150.

In the MUX switching unit 1411, first to third data lines DL1, DL2, and DL3 which are electrically connected to a first output channel Ch1 of a data driver 130 in accordance with first and second control signals S1 and S2 and fourth to sixth data lines DL4, DL5, and DL6 which are electrically connected to a second output channel Ch2 are disposed. Here, the first to third data lines DL1 to DL3 may apply data signals to sub pixels implementing different colors included in the first pixel and the fourth to sixth data lines DL4 to DL6 may apply data signals to sub pixels implementing different colors included in a second pixel which is adjacent to the first pixel. The MUX switching unit 1411 includes first to sixth MUX switches TM1, TM2, TM3, TM4, TM5, and TM6 disposed in individual data lines. The first output channel Ch1 and the second output channel Ch2 may supply red data, green data, and blue data during one horizontal period 1H in a time-division manner. Even though in FIG. 4, the first to sixth MUX switches TM1 to TM6 are configured by NMOS transistors, the present disclosure is not limited thereto and the first to sixth MUX switches TM1 to TM6 may be configured by PMOS transistors.

A connection method of the first channel Ch1 and the second channel Ch2 and the first to sixth data lines DL1 to DL6 during one horizontal period will be described. The first channel Ch1 and the second channel Ch2 are connected to the first data line DL1 and the fourth data line DL4, respectively, during a first period which is an initial one-third horizontal period in response to the first and second control signals S1 and S2. The first channel Ch1 and the second channel Ch2 are connected to the second data line DL2 and the fifth data line DL5, respectively, during a second period which is a next one-third horizontal period. Further, the first channel Ch1 and the second channel Ch2 are connected to the third data line DL3 and the sixth data line DL6, respectively, during a third period which is a last one-third horizontal period. In this case, data signals having different polarities need to be applied to adjacent pixels due to inversion driving. Therefore, the red data R1 and R2 having different polarities are applied to the first data line DL1 and the fourth data line DL4, the green data G1 and G2 having different polarities are applied to the second data line DL2 and the fifth data line DL5, and the blue data B1 and B2 having different polarities are applied to the third data line DL3 and the sixth data line DL6.

As compared with FIG. 3, in the MUX switching unit 1411 of the MUX driver 140-1 of FIG. 4, only one MUX switch is disposed in one line to which the MUX control signal is applied. Further, the first to third MUX switches TM1 to TM3 connected to the first to third data lines DL1 to DL3 connected to the first channel Ch1 are controlled by a first control signal S1 and the fourth to sixth MUX switches TM4 to TM6 connected to the fourth to sixth data lines DL4 to DL6 connected to the second channel Ch2 are controlled by a second control signal S2. That is, when a resolution of the input image signal RGB is high, all the first to sixth MUX switches TM1 to TM6 may be turned on by the first control signal S1 and the second control signal S2. In contrast, when a resolution of the input image signal RGB is low, only some MUX switches TM1 to TM6 corresponding to any one of the first control signal S1 and the second control signal S2 may be turned on. For example, when the first control signal S1 is applied, only the first to third MUX switches TM1 to TM3 are turned on and when the second control signal S2 is applied, only the fourth to sixth MUX switches TM4 to TM6 are turned on.

Therefore, only one MUX switch is disposed in one line to which the MUX control signal is applied so that the load of the signal line may be reduced and the data may be output through data lines connected to the first channel Ch1 or the second channel Ch2 in accordance with the first control signal S1 or the second control signal S2.

In the meantime, the configuration of the output selecting unit 1421 of the MUX driver 140-1 of FIG. 4 is the same as the configuration of the output selecting unit 142 of FIG. 3, so that a detailed description will be omitted.

The driving of the MUX driver of FIG. 4 will be described in more detail. When the resolution of the input image signal RGB is high, the first control signal S1 and the second control signal S2 are applied to the MUX switching unit 1411 so that the first to sixth MUX switches TM1 to TM6 corresponding thereto are turned on and all the first to third switches TS1 to TS3 of the output selecting unit 1421 are turned off. Therefore, all the data is output to the first to sixth data lines DL1 to DL6. That is, when the resolution of the input image signal RGB is high, the MUX driver may be driven similarly to a MUX driver of a general display device.

In contrast, when the resolution of the input image signal RGB is low, the fourth to sixth MUX switches TM4 to TM6 of the MUX switching unit 1411 are turned off. Therefore, data may not be output to the fourth to sixth data lines DL4 to DL6 connected to the second channel Ch2 between the first channel Ch1 and the second channel Ch2. When the first to third switches TS1 to TS3 are turned on by the multi enable control signal MRE, the red data R1 output through the first data line DL1 is output through the first data line DL1 and the fourth data line DL4, the green data G1 which is output through the second data line DL2 is copied to the fifth data line DL5 to be output through the fifth data line DL5. Further, the blue data B1 output through the third data line DL3 is copied to the sixth data line DL6 to be output through the six data line DL6. In this case, red, green, and blue data output through the first to third data lines DL1 to DL3 and red, green, and blue data output through the fourth to sixth data lines DL4 to DL6 may have the same polarity.

As described above, when the resolution of the input image signal RGB is high, the MUX driver 140 of the display device 100 according to the exemplary aspect of the present disclosure outputs data through all data lines DL1 to DL6 connected to the first channel Ch1 and the second channel Ch2 to display an image having a high resolution.

When the resolution of the input image signal RGB is low, the red data, the green data, and the blue data are output only through the first to third data lines DL1 to DL3 connected to the first channel Ch1 between the first channel Ch1 and the second channel Ch2. Further, the red data, the green data, and the blue data which are output from the first channel Ch1 are copied to be output to the fourth to sixth data lines DL4 to DL6 connected to the second channel Ch2 which is not used. Therefore, the overall power consumption of the display device 100 may be reduced.

Figure 5:
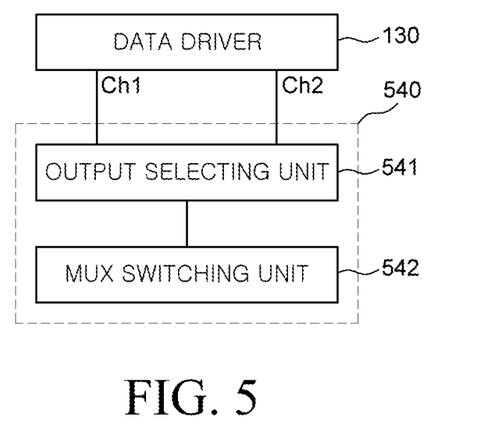
FIG. 5 is a block diagram for explaining a MUX driver of a display device according to another exemplary aspect of the present disclosure.

FIG. 5 is a block diagram for explaining a MUX driver of a display device according to another exemplary aspect of the present disclosure.

Referring to FIG. 5, a MUX driver 540 of a display device according to another exemplary aspect of the present disclosure includes an output selecting unit 541 and a MUX switching unit 542. As compared with the MUX driver 140 of FIGS. 1 to 4, in the MUX driver 540, an arrangement of the output selecting unit and the MUX switching unit may be different. The output selecting unit 541 of the MUX driver 540 of the display device according to another exemplary aspect of the present disclosure is disposed between the data driver 130 and the MUX switching unit 542 and the MUX switching unit 542 may be disposed between the out selecting unit 541 and the display panel 110.

Figure 6:
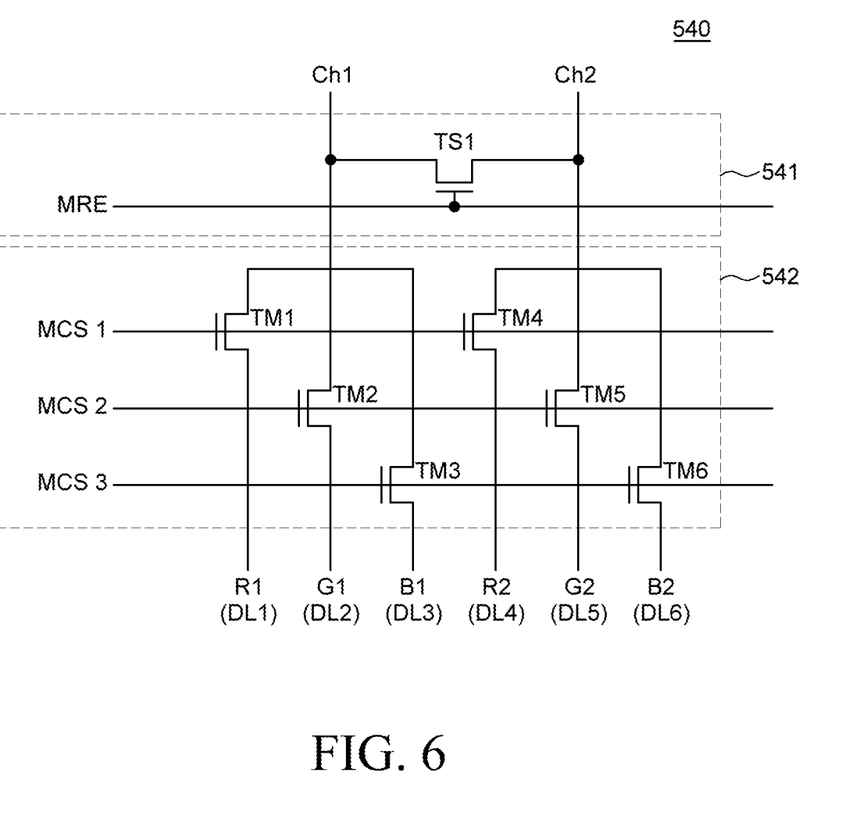
FIG. 6 is a view for explaining an example of a detailed structure of the MUX driver of FIG. 5.

FIG. 6 is a view for explaining an example of a detailed structure of the MUX driver of FIG. 5.

Prior to referring to FIG. 6, the MUX switching unit 542 of FIG. 5 has the same configuration as the MUX switching unit 141 of FIG. 3 so that a detailed description of the MUX switching unit 542 will be omitted.

Referring to FIG. 6, the output selecting unit 541 includes one switch TS1. In the switch TS1, a gate is connected to a multi enable line and a source and a drain are connected to a first output channel Ch1 and a second output channel Ch2, respectively.

The driving of FIG. 6 will be described. When a resolution of the input image signal RGB is high, the switch TS1 of the output selecting unit 541 is turned off by the multi enable control signal MRE. When the switch TS1 of the output selecting unit 541 is turned off, the data may be output through the first to sixth data lines DL1 to DL6 connected to the first channel Ch1 and the second channel Ch2. In this case, red data R1 and R2, green data G1 and G2, and blue data B1 and B2 which are output through the first channel Ch1 and the second channel Ch2, respectively, may have different polarities.

In contrast, when a resolution of the input image signal RGB is low, the switch TS1 of the output selecting unit 541 is turned on by the multi enable control signal MRE. When the switch TS1 of the output selecting unit 541 is turned on, the red data, the green data, and the blue data are output only through the first to third data lines DL1 to DL3 connected to the first channel Ch1 between the first channel Ch1 and the second channel Ch2. Further, the red data, the green data, and the blue data which are output from the first channel Ch1 are copied to be output to the fourth to sixth data lines DL4 to DL6 connected to the second channel Ch1 which is not used. Therefore, the overall power consumption of the display device may be reduced. That is, when the display device according to another exemplary aspect of the present disclosure displays an image having a low resolution, data having one polarity is output through the MUX driver 540, so that fluctuation of a voltage is reduced. Therefore, the power consumption of the display device may be reduced.

However, in the MUX driver 540 as illustrated in FIG. 6, for example, two MUX switches TM1 and TM4 are disposed in a signal line to which the first MUX control signal MCS1 is applied, as described with reference to FIG. 3, so that a load of one signal line may be increased. Therefore, the display device 100 according to the exemplary aspect of the present disclosure suggests a configuration of a MUX driver as illustrated in FIG. 7 which may reduce the load of the signal line.

Figure 7:
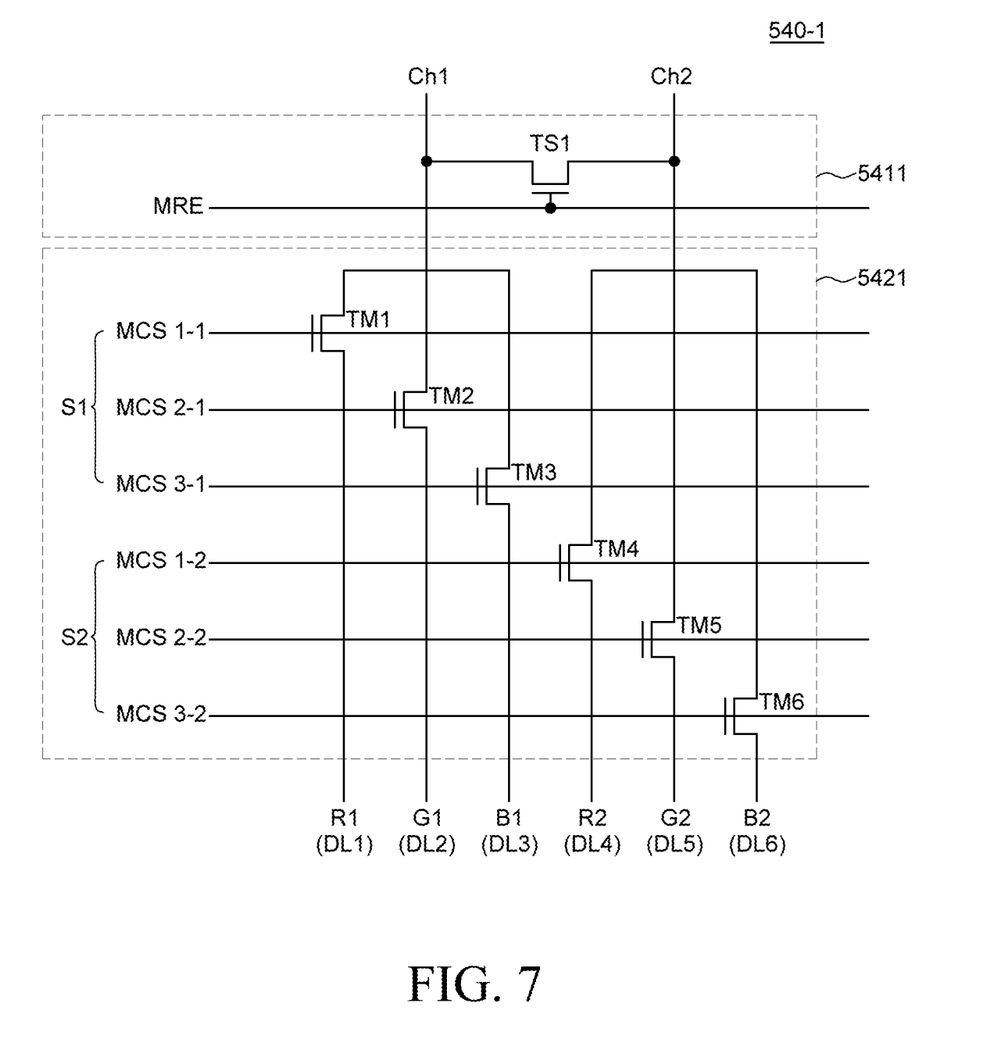
FIG. 7 is a view for explaining another example of a detailed structure of the MUX driver of FIG. 5.

FIG. 7 is a view for explaining another example of a detailed structure of the MUX driver of FIG. 5.

Referring to FIG. 7, the MUX driver 540-1 may include an output selecting unit 5411 having the same configuration as described with reference to FIG. 6 and a MUX switching unit 5421 having the same configuration as described with reference to FIG. 4. The MUX driver 540-1 of FIG. 7 is formed by combining the configuration described above so that the driving is also similar. Therefore, a detailed description thereof will be omitted.

The exemplary aspects of the present disclosure can also be described as follows:

According to an aspect of the present disclosure, display device may comprise a display panel which includes a plurality of pixels including a plurality of sub pixels implementing different colors and a plurality of data lines connected to the sub pixels, a data driver including a first output channel and a second output channel for supplying a data signal to a corresponding one of the plurality of data lines; and a MUX driver disposed between the display panel and the data driver, and controls data outputs of the plurality of data lines connected to the first output channel and the second output channel in accordance with a resolution of an image signal input from the outside. The MUX driver may include a MUX switching unit including first to third MUX switches for connecting to the first to third data lines connected to the first output channel and fourth to sixth MUX switches for connecting to the fourth to sixth data lines connected to the second output channel, and an output selecting unit including a first switch, a second switch and a third switche electrically connecting data lines for outputting data corresponding to the same color, among the first to sixth data lines.

The first to third data lines may be connected to a red sub pixel, a green sub pixel, and a blue sub pixel which are included in a first pixel among the plurality of pixels of the display panel, respectively and the fourth to sixth data lines are connected to a red sub pixel, a green sub pixel, and a blue sub pixel which are included in a second pixel which is adjacent to the first pixel, among the plurality of pixels of the display panel, respectively, and the first switch of the output selecting unit electrically connects the first data line and the fourth data line to each other in accordance with the resolution, the second switch of the output selecting unit electrically connects the second data line and the fifth data line to each other in accordance with the resolution, and the third switch of the output selecting unit electrically connects the third data line and the sixth data line to each other.

The first to third switches of the output selecting unit may be turned on or turned off by a multi enable signal.

The MUX driver further includes a multi enable line which transmits the multi enable signal to the first to third switches and each gate of the first to third switches is connected to the multi enable line.

When a resolution of the input image signal is high, the multi enable signal may control the first to third switches to be turned off and when a resolution of the input image signal is low, the multi enable signal may control the first to third switches to be turned on.

The MUX switching unit may be disposed between the data driver and the output selecting unit and the output selecting unit may be disposed between the MUX switching unit and the display panel.

The MUX driver includes a MUX switching unit including first to third MUX switches for connecting to the first to third data lines connected to the first output channel and fourth to sixth MUX switches connected to the fourth to sixth data lines for connecting to the second output channel; and an output selecting unit including switch for selecting an output channel in accordance with the resolution of the first output channel and the second output channel.

The MUX switching unit may be disposed between the output selecting unit and the display panel and the output selecting unit may be disposed between the data driver and the MUX switching unit.

The switches of the output selecting unit may be turned on or turned off by the multi enable signal.

According to an another aspect of the present disclosure, a display device may comprise a display panel including a plurality of data lines, a data driver including a first output channel and a second output channel for supplying a data signal to a corresponding one of the plurality of data lines and a MUX driver disposed between the display panel and the data driver, and outputs data having different polarities when a resolution of an image signal input from the outside is high and outputs data having the same polarity when the resolution of an image signal input from the outside is low.

When the resolution of an image signal input from the outside is low, the MUX driver may select one output channel of the first output channel and the second output channel to output data through a plurality of data lines connected to the one selected output channel.

The MUX driver may copy and output data of the plurality of data lines connected to the selected output channel to a plurality of data lines connected to the other one output channel which is not selected of the first output channel and the second output channel.

When the resolution of an image signal input from the outside is high, the MUX driver may output a plurality of data through a plurality of data lines connected to the first output channel and the second output channel.

Although the aspects of the present disclosure have been described in detail with reference to the accompanying drawings, it is to be understood that the present disclosure is not limited to those described aspects and various changes and modifications may be made without departing from the scope of the present disclosure. Therefore, the aspects disclosed in the present disclosure are not intended to limit the technical scope of the present disclosure, but to illustrate them. Thus, the technical scope of the present disclosure is not limited by these aspects. It should be understood that the above-described aspects are merely illustrative in all aspects and not restrictive. The scope of the present disclosure should be construed only by the appended claims, and all technical features within the scope of equivalents should be construed as being included in the scope of the present disclosure.

What is claimed is:

1. A display device, comprising:
   a display panel which includes a plurality of pixels each having a plurality of sub pixels implementing different colors and a plurality of data lines connected to the plurality sub pixels;
   a data driver including a first output channel and a second output channel for supplying a data signal to a corresponding one of the plurality of data lines; and
   a MUX driver disposed between the display panel and the data driver, and controls data outputs of the plurality of data lines connected to the first output channel and the second output channel in accordance with a resolution of an image signal input,
   wherein the MUX driver includes:
   a MUX switching unit including first to third MUX switches for respectively connecting to the first to third data lines connected to the first output channel and fourth to sixth MUX switches for respectively connecting to the fourth to sixth data lines connected to the second output channel; and
   an output selecting unit including a first switch, a second switch and a third switch electrically connecting the data lines among the first to sixth data lines outputting data corresponding to the same color.

2. The display device according to claim 1, wherein the first to third data lines are connected to a red sub pixel, a green sub pixel and a blue sub pixel which are included in a first pixel among the plurality of pixels of the display panel and the fourth to sixth data lines are connected to a red sub pixel, a green sub pixel and a blue sub pixel which are included in a second pixel which is adjacent to the first pixel, among the plurality of pixels of the display panel and
   wherein the first switch of the output selecting unit electrically connects the first data line and the fourth data line to each other in accordance with the resolution, the second switch of the output selecting unit electrically connects the second data line and the fifth data line to each other in accordance with the resolution, and the third switch of the output selecting unit electrically connects the third data line and the sixth data line to each other.

3. The display device according to claim 2, wherein the first to third switches of the output selecting unit are turned on or turned off by a multi enable signal.

4. The display device according to claim 3, wherein the MUX driver further comprises a multi enable line which transmits the multi enable signal to the first to third switches and each gate of the first to third switches is connected to the multi enable line.

5. The display device according to claim 4, wherein the multi enable signal controls the first to third switches to be turned off when a resolution of the input image signal is high, and the multi enable signal controls the first to third switches to be turned on when a resolution of the input image signal is low.

6. The display device according to claim 2, wherein the MUX switching unit is disposed between the data driver and the output selecting unit, and the output selecting unit is disposed between the MUX switching unit and the display panel.

7. A display device, comprising:
   a display panel which includes a plurality of pixels each having a plurality of sub pixels implementing different colors and a plurality of data lines connected to the plurality sub pixels;
   a data driver including a first output channel and a second output channel for supplying a data signal to a corresponding one of the plurality of data lines; and
   a MUX driver disposed between the display panel and the data driver, and controls data outputs of the plurality of data lines connected to the first output channel and the second output channel in accordance with a resolution of an image signal input,
   wherein the MUX driver includes:

a MUX switching unit including first to third MUX switches for connecting to the first to third data lines connected to the first output channel and fourth to sixth MUX switches connected to the fourth to sixth data lines for connecting to the second output channel; and an output selecting unit including a switch for selecting an output channel in accordance with the resolution of the first output channel and the second output channel.

8. The display device according to claim 7, wherein the MUX switching unit is disposed between the output selecting unit, and the display panel and the output selecting unit is disposed between the data driver and the MUX switching unit.

9. The display device according to claim 8, wherein the switch of the output selecting unit is turned on or turned off by the multi enable signal.

10. A display device, comprising:
a display panel including a plurality of data lines;
a data driver including a first output channel and a second output channel for supplying a data signal to a corresponding one of the plurality of data lines; and
a MUX driver disposed between the display panel and the data driver, and outputs data having different polarities when a resolution of an image signal input from the outside is high and outputs data having the same polarity when the resolution of an image signal input from the outside is low.

11. The display device according to claim 10, wherein the MUX driver selects one of the first output channel and the second output channel and outputs data through a plurality of data lines connected to the selected output channel when the resolution of an image signal input from the outside is low.

12. The display device according to claim 11, wherein the MUX driver copies and outputs data of the plurality of data lines connected to the selected output channel to a plurality of data lines connected to the other output channel, which is the non-selected output channel.

13. The display device according to claim 10, wherein the MUX driver outputs a plurality of data through a plurality of data lines connected to the first output channel and the second output channel when the resolution of an image signal input from the outside is high.

14. A display device, comprising:
a display panel including a plurality of pixels each having a plurality of sub pixels implementing different colors and a plurality of data lines connected to the plurality sub pixels;
a data driver including a first output channel and a second output channel for supplying a data signal to a corresponding one of the plurality of data lines; and
a MUX driver disposed between the display panel and the data driver, controlling to output color data from the plurality of data lines connected to the first output channel and the second output channel when a resolution of an image signal input is high, and controlling to output color data only from selected data lines among the plurality of data lines connected to the first output channel and outputting the color data the same as the first output channel from the second output channel when a resolution of an image signal input is low.

15. The display device according to claim 14, wherein the color data includes red, green and blue color data.

16. The display device according to claim 14, wherein the selected data lines includes first to third data lines.

17. The display device according to claim 14, wherein the MUX driver includes:
a MUX switching unit including first to third MUX switches for respectively connecting to the first to third data lines connected to the first output channel and fourth to sixth MUX switches for respectively connecting to the fourth to sixth data lines connected to the second output channel; and
an output selecting unit including a first switch, a second switch and a third switch electrically connecting the data lines among the first to sixth data lines for outputting data corresponding to the same color.

18. The display device according to claim 17, wherein the first to third data lines are connected to a red sub pixel, a green sub pixel and a blue sub pixel which are included in a first pixel among the plurality of pixels of the display panel and the fourth to sixth data lines are connected to a red sub pixel, a green sub pixel and a blue sub pixel which are included in a second pixel which is adjacent to the first pixel, among the plurality of pixels of the display panel.

19. The display device according to claim 17, wherein the first switch of the output selecting unit electrically connects the first data line and the fourth data line to each other in accordance with the resolution, and the second switch of the output selecting unit electrically connects the second data line and the fifth data line to each other in accordance with a resolution, and the third switch of the output selecting unit electrically connects the third data line and the sixth data line to each other.

* * * * *